(12) United States Patent
Zhao et al.

(10) Patent No.: US 9,269,613 B2
(45) Date of Patent: Feb. 23, 2016

(54) COPPER INTERCONNECT STRUCTURE AND METHOD FOR MANUFACTURING THE SAME

(75) Inventors: Yuhang Zhao, Shanghai (CN); Xiaoxu Kang, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 159 days.

(21) Appl. No.: 14/125,314

(22) PCT Filed: Dec. 20, 2011

(86) PCT No.: PCT/CN2011/084278
§ 371 (c)(1),
(2), (4) Date: Dec. 11, 2013

(87) PCT Pub. No.: WO2013/075375
PCT Pub. Date: May 30, 2013

(65) Prior Publication Data
US 2014/0138835 A1    May 22, 2014

(30) Foreign Application Priority Data
Nov. 25, 2011   (CN) .......................... 2011 1 0383348

(51) Int. Cl.
*H01L 21/768* (2006.01)
*H01L 23/532* (2006.01)
*H01L 23/528* (2006.01)

(52) U.S. Cl.
CPC ...... *H01L 21/7682* (2013.01); *H01L 21/76807* (2013.01); *H01L 23/528* (2013.01); *H01L 23/53238* (2013.01); *H01L 23/53295* (2013.01); *H01L 21/76804* (2013.01); *H01L 2924/0002* (2013.01)

(58) Field of Classification Search
USPC .......................................................... 257/758
See application file for complete search history.

(56) References Cited

U.S. PATENT DOCUMENTS

| | | | |
|---|---|---|---|
| 6,204,080 B1 * | 3/2001 | Hwang | 438/29 |
| 7,790,601 B1 * | 9/2010 | Choi et al. | 438/619 |
| 8,232,653 B2 * | 7/2012 | Lee | 257/774 |
| 8,298,911 B2 * | 10/2012 | Lee | 438/421 |
| 2002/0079585 A1 * | 6/2002 | Wong | 257/758 |
| 2005/0179135 A1 | 8/2005 | Kumar | |
| 2008/0073748 A1 * | 3/2008 | Bielefeld et al. | 257/522 |
| 2010/0301486 A1 * | 12/2010 | Frohberg et al. | 257/770 |

FOREIGN PATENT DOCUMENTS

| | | |
|---|---|---|
| CN | 1501492 A | 6/2004 |
| JP | 9172079 A | 6/1997 |

*Primary Examiner* — Thao X Le
*Assistant Examiner* — Gardner W Swan

(57) ABSTRACT

A method is disclosed for manufacturing a semiconductor device with a copper interconnect structure. The method includes providing a substrate, forming a first interconnect dielectric layer on the substrate, and forming a second interconnect dielectric layer on a surface of the first interconnect dielectric layer. The method also includes forming a plurality of conduits extending through the first interconnect dielectric layer and the second interconnect dielectric layer, and depositing copper in the plurality of conduits to form a copper interconnect layer of the copper interconnect structure. Further, the first interconnect dielectric layer, between neighboring conduits, contains cavities such that dielectric constant of the first interconnect dielectric layer is reduced. The second interconnect dielectric layer seals the top of the cavities, the substrate is the bottom of the cavities, and a width of the top of the cavities is less than a width of the bottom of the cavities.

9 Claims, 8 Drawing Sheets

20

COPPER INTERCONNECT STRUCTURE AND METHOD FOR MANUFACTURING THE SAME

CROSS REFERENCE TO RELATED APPLICATIONS

This application claims the priority benefit of International Patent Application Serial No. PCT/CN2011/084,278, filed Dec. 20, 2011, which is related to and claims the priority benefit of China patent application serial no. 201110383348.X filed Nov. 25, 2011. The entirety of each of the above-mentioned patent applications is hereby incorporated by reference herein and made a part of this specification.

FIELD OF THE INVENTION

The present invention generally relates the field of semiconductor technologies and, more particularly, to copper interconnect technologies.

BACKGROUND OF THE INVENTION

With the explosive growth in the information created by the current society, there are ever-increasing demands for information processing, transmission, and storage. Driven by these demands, as the cornerstone of the information industry, the semiconductor industry, especially with regards to the CMOS technology, has been on a rapid growth path according to Moore's Law, thereby becoming the fastest growing industry over the past 50 years.

With the rapid development of the CMOS technology, the integration degree of devices in a semiconductor chip has been constantly increased, and the chip speed is becoming faster and faster. To meet the requirements of such integration degree and chip speed, the copper interconnect is gradually replacing the traditional aluminum interconnect for mainstream applications. At the same time, the line width of the interconnect is being reduced, wiring density is being increased, and line spacing is being decreased, which leads sharp increases in parasitic capacitance.

Device delay and interconnect delay together determine the maximum operating frequency of a circuit. As dimensions of the device continue to shrink, the interconnect delay has exceeded the device delay and become a major factor impacting the circuit operating frequency. Although using low-k dielectric can reduce the parasitic capacitance contributed by the interconnect, its application has also brought many other problems, such as integration issues and reliability issues, etc. Also, the dielectric constant of the low-k dielectric materials may reach the limit at about 1.5. Nevertheless, it is expected that the application of depositing the low-k materials by CVD processes may continue until the year of 2020. However, research and development for post-copper-interconnect technologies (including optical interconnect, carbon nano-material interconnect, cavity insulation technology, etc.) cannot be delayed.

Using the low-k materials in late-stage interconnect can greatly reduce the interconnect delay and improve chip performance. However, the conversion to the low-k (roughly defined as dielectric constant k≤3.0) material by the industry took longer than expected, because the inherent poor mechanical and chemical stability of the low-k dielectric can lead to poor assembly performance and can also pose serious reliability questions at the same time.

In order to improve the interconnect performance, copper and silicon dioxide interconnect technology was introduced as early as in 1998. However, it has been difficult to meet the requirement of reducing the dielectric constant of the late-stage insulator. Fluorine-doped silicon dioxide (k=3.7) was only introduced in the 180 nm technology, while insulating materials with k=2.7~3.0 was not widely used even in the 90 nm technology, mostly because the reliability and yield problems were more challenging than expected when using the dual-damascene copper process to integrate these materials.

Existing advanced CMOS technology generally defines three types of interconnect: local interconnect, intermediate interconnect, and global interconnect. The local interconnect has the highest wiring density and smallest line spacing, and is often arranged at bottom levels of the interconnect structure, including contact, metal1, via1, metal2, via2 and other levels. Because the local interconnect has small size and high wiring density, the local interconnect is more susceptible to performance and reliability degrading caused by parasitic capacitance. On the other hand, the middle interconnect and global interconnect have relatively large sizes and low wiring density and, therefore, are less affected by the small-size effect.

The disclosed methods and systems are directed to solve one or more problems set forth above and other problems.

SUMMARY OF THE INVENTION

One aspect of the present disclosure includes a method for manufacturing a semiconductor device with a copper interconnect structure. The method includes providing a substrate, forming a first interconnect dielectric layer on the substrate, and forming a second interconnect dielectric layer on a surface of the first interconnect dielectric layer. The method also includes forming a plurality of conduits trenches extending through the first interconnect dielectric layer and the second interconnect dielectric layer, and depositing copper in the plurality of conduits to form a copper interconnect layer of the copper interconnect structure. Further, the first interconnect dielectric layer, between neighboring conduits trenches, contains a plurality of cavities such that dielectric constant of the first interconnect dielectric layer is reduced. The second interconnect dielectric layer seals the top of the cavities, the substrate forms a bottom surface of the cavities, and a width of the top of the cavities is less than a width of the bottom of the cavities.

Another aspect of the present disclosure includes a semiconductor device with a copper interconnect. The device includes a substrate, a first interconnect dielectric layer formed on the substrate, and a second interconnect dielectric layer formed on a surface of the first interconnect dielectric layer. The device also includes a plurality of first conduits formed in the first interconnect dielectric layer and the second interconnect dielectric layer and extending through the first interconnect dielectric layer and the second interconnect dielectric layer. Further, the device includes a copper interconnect layer formed by depositing copper in at least the plurality of first conduits. The first interconnect dielectric layer, between neighboring trenches, contains a plurality of cavities. The second interconnect dielectric layer is configured to seal the top of the cavities, the substrate is arranged as the bottom of the cavities, and a width of the top of the cavities is less than a width of the bottom of the cavities.

Other aspects of the present disclosure can be understood by those skilled in the art in light of the description, the claims, and the drawings of the present disclosure.

DETAILED DESCRIPTION OF THE EMBODIMENTS

Reference will now be made in detail to exemplary embodiments of the invention, which are illustrated in the accompanying drawings. Wherever possible, the same reference numbers may be used throughout the drawings to refer to the same or like parts.

Figure 1:
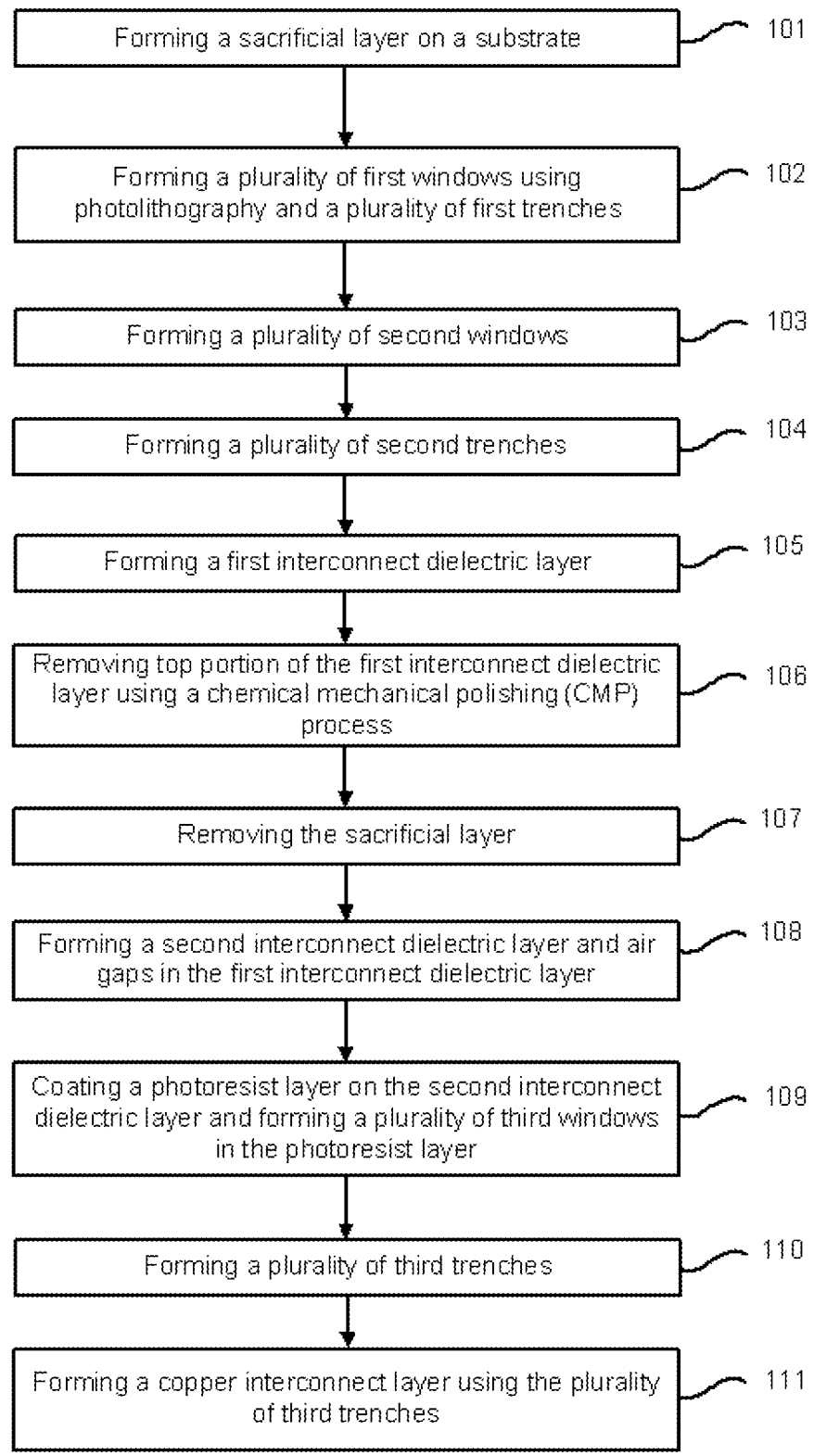
FIG. 1 illustrates an exemplary process for manufacturing a copper interconnect in a semiconductor device consistent with the disclosed embodiments.
Figure 2A:
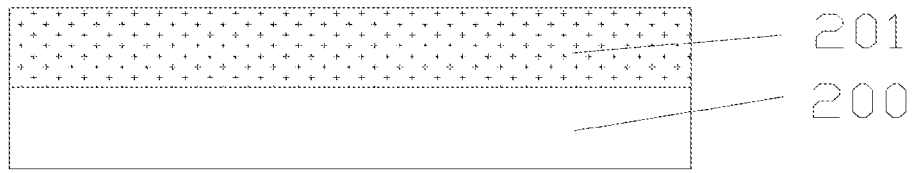
FIGS. 2A-2L illustrate certain corresponding stages of the semiconductor device during the copper interconnect manufacturing process consistent with the disclosed embodiments.

FIG. 1 illustrates an exemplary process for manufacturing copper interconnect in a semiconductor device consistent with the disclosed embodiments. To make the copper interconnect, a semiconductor substrate may be first provided. As shown in FIG. 1, after the substrate is provided, a sacrificial layer may be formed on the substrate (101). FIG. 2A shows a corresponding semiconductor device 20 after forming the sacrificial layer.

As shown in FIG. 2A, a sacrificial layer 201 is formed on substrate 200. The substrate may include any appropriate material for manufacturing CMOS and other semiconductor devices. For example, the substrate may include silicon, silicon dioxide, aluminum oxide, sapphire, germanium, gallium arsenide (GaAs), an alloy of silicon and germanium, or indium phosphide (InP), etc. Other materials or combinations may also be used. Further, the substrate may contain other circuit structures already fabricated and ready to be interconnected or wired.

The sacrificial layer 201 may be formed on the substrate 200 by any appropriate methods. For example, the sacrificial layer 201 may be deposited on the substrate 200. Other methods may also be used. Further, the sacrificial layer 201 may include any appropriate material suitable for forming a sacrificial layer in a semiconductor fabrication process, such as amorphous silicon or polyamide.

Figure 2B:
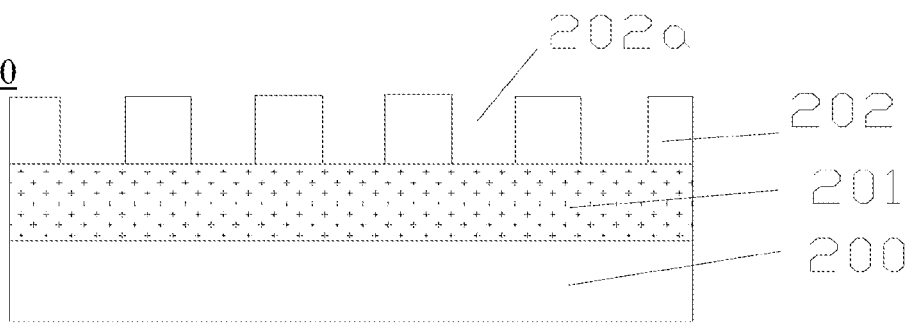
Figure 2C:
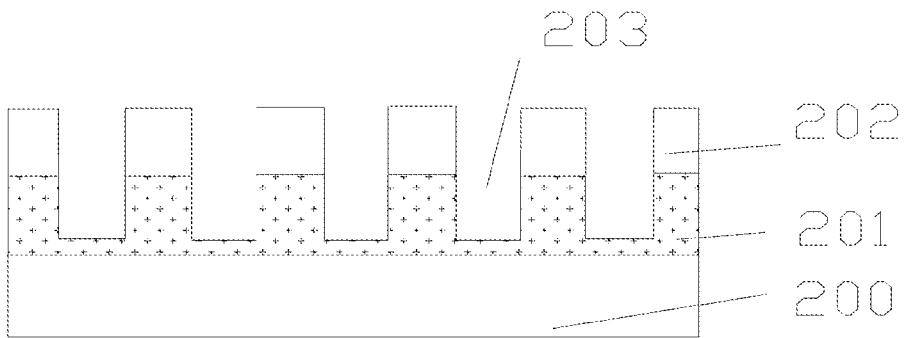

Returning to FIG. 1, after forming the sacrificial layer (101), a plurality of first windows may be formed using photolithography and a plurality of first trenches are also formed based on the plurality of first windows (102). More particularly, the sacrificial layer may first be coated with a photoresist layer. A first mask is used to form the plurality of first windows in the photoresist layer by photolithography. Further, using the first windows as a mask, the plurality of first trenches may be formed in the sacrificial layer by removing portions of the sacrificial layer. FIG. 2B shows the corresponding semiconductor device 20 after forming the first windows, and FIG. 2C shows the corresponding semiconductor device 20 after forming the first trenches.

As shown in FIG. 2B, the sacrificial layer 201 is coated with photoresist layer 202. A pattern of plurality of first windows 202a is formed in the photoresist layer 202 by photolithography using a corresponding first mask (not shown). For example, using the first mask, exposure, development, and etching may be performed on the photoresist layer 202 to form the plurality of first windows 202a. Further, as shown in FIG. 2C, a plurality of first trenches 203 are formed in the sacrificial layer 201. The plurality of first trenches 203 may be formed in the sacrificial layer 201 by an etching process using the first windows 202a as a mask (i.e., the photoresist layer 202 with the pattern of the plurality of first windows 202a).

The etching process for removing the portions of the sacrificial layer 201 may use any appropriate etching method, such as dry releasing or dry etching, wet etching, or thermal decomposition, etc., with any appropriate type of etchant. In certain embodiments, when the sacrificial layer 201 is amorphous silicon, the etchant may be $XeF_2$; when the sacrificial layer 201 is polymide, the enchant may be $O_2$. Other materials may also be used. Certain portions of sacrificial layer 201 at the bottoms of the first trenches 203 may remain.

Figure 2D:
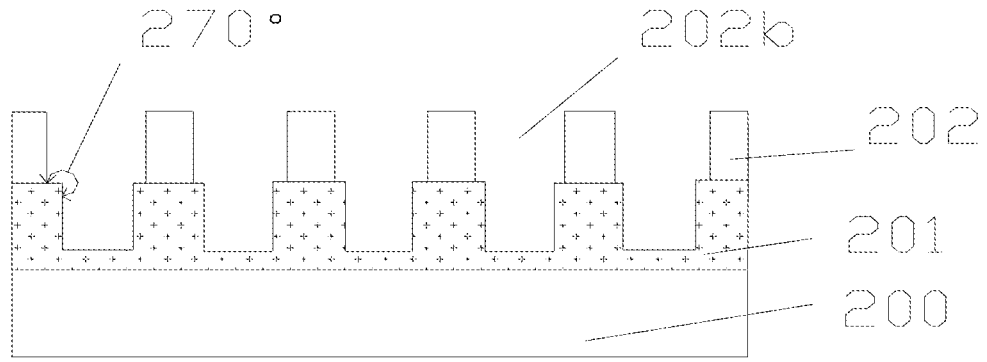

Returning to FIG. 1, after forming the first windows and first trenches (102), a plurality of second windows may be formed based on the plurality of first windows (103). The width of each second window may be greater than the width of a corresponding first window. More particularly, the plurality of second windows may be formed by widening the respective plurality of first windows. FIG. 2D shows the corresponding semiconductor device 20 after forming the second windows.

As shown in FIG. 2D, plurality of second windows 202b are formed in the photoresist layer 202 by widening corresponding first windows 202a, such that each second window 202b has a width greater than that of a corresponding first window 202a. To form the second windows 202b, the first windows 202a may be widened using a photoresist trim (PR trim) process, which may use $O_2$ plasma to remove a portion of the photoresist layer around the first windows 202a to enlarge the first windows 220a horizontally to form the second windows 202b. Other methods may also be used. Because the width of a second window 202b is greater than the width of a first window 202a, a top portion of the sacrificial layer is exposed in each second window 202b and the exposed portion may be at a 270-degree angle.

Figure 2E:
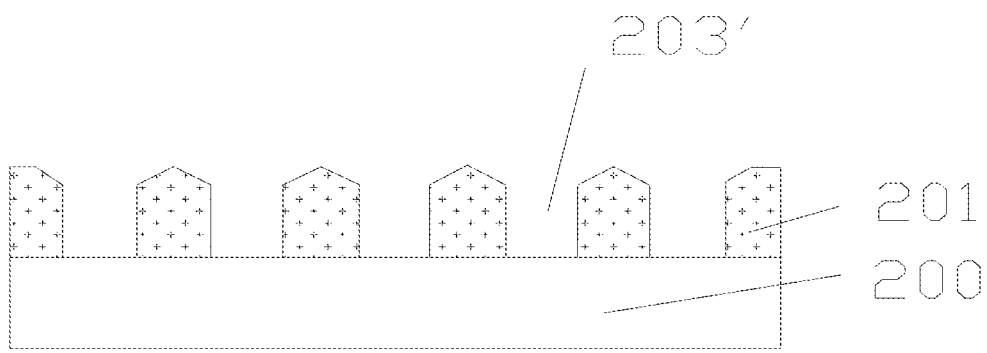

Further, returning to FIG. 1, a plurality of second trenches may be formed in the sacrificial layer based on the plurality of second windows (104). The second trenches may be formed in the sacrificial layer by an etching process using the plurality of second windows as a mask. FIG. 2E shows the corresponding semiconductor device 20 after forming the second trenches.

As shown in FIG. 2E, a plurality of second trenches 203' are formed in the sacrificial layer 201 and extend to the substrate 200. The plurality of second trenches 203' may be formed by etching the sacrificial layer 201 using the photoresist layer 202 having the plurality second windows 202b as a mask. During the etching process, because the top portion of the sacrificial layer 201 exposed by the plurality second windows 202b has an acceptance angle of 270 degrees, the top portion of the sacrificial layer 201 may be able to accept etching effects from all directions to be in a shape of a trapezoidal, while the lower portion of the sacrificial layer 201 remain in a shape of a rectangle. Thus, the top portion of each second trench 203' may have a shape of an inverted trapezoidal, the particular size and shape of which may be controlled by the etching parameters, such as etching time and rate, etc. The previously remaining portions of sacrificial layer 201 at the bottoms of the first trenches 203 may also be etched away when forming the second trenches 203'.

After forming the second trenches 203', the photoresist layer 202 may be removed completely. Although forming the second trenches 203' as shown are performed after forming the second windows 202b, the second trenches 203' may also be formed by etching the sacrificial layer 201 directly using the plurality of first windows 202a as a mask under certain fabrication conditions, without keeping any portion of the sacrificial layer 201 at the bottoms of the etched first trenches.

Figure 2F:
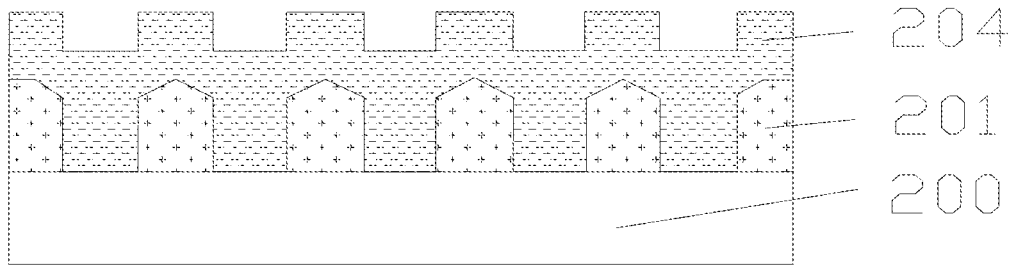

Returning to FIG. 1, after forming the second trenches (104), a first interconnect dielectric layer is formed on the sacrificial layer (105). More particularly, the first interconnect dielectric layer may be deposited on the sacrificial layer and in the second trenches. FIG. 2F shows the corresponding semiconductor device 20 after forming the first interconnect dielectric layer.

As shown in FIG. 2F, first interconnect dielectric layer 204 is formed on the sacrificial layer 201 and also filled in the second trenches 203'. The first interconnect dielectric layer 204 may be formed using a deposition process and may include any appropriate material, such as $SiO_2$, SiON, SiN, SiC, silicon-based dielectric doped with F, C, H, B or P impurities, or low dielectric-constant films.

Figure 2G:
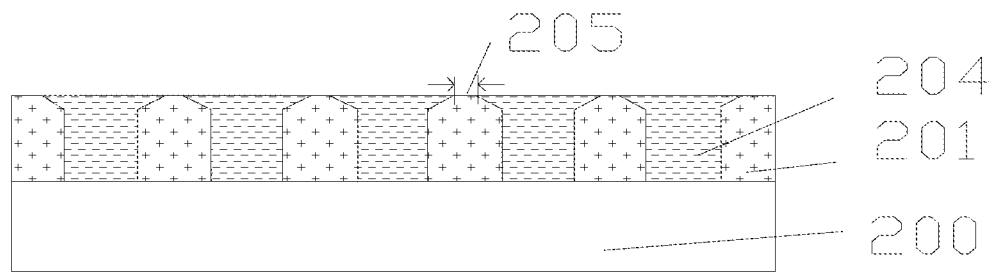

Further, returning to FIG. 1, top portion of the first interconnect dielectric layer may be removed using a chemical mechanical polishing (CMP) process (106). More specifically, certain top portion of the first interconnect dielectric layer is removed in the CMP process such that a tip of the sacrificial layer is also removed to form a releasing opening. FIG. 2G shows the corresponding semiconductor device 20 after removing the top portion of the first interconnect dielectric layer.

As shown in FIG. 2G, top portion of the first interconnect dielectric layer 204 is removed with a CMP process such that a tip of the sacrificial layer 201 between the second trenches 209 is also removed to form a releasing opening 205. The tip portion has a width significantly smaller than the bottom portion of the sacrificial layer 201 between the second trenches 209, and the actual width of the releasing opening 205 may be determined based on particular applications. In certain embodiments, the width of the releasing opening may be in a range of approximately 10 nm-300 nm.

Figure 2H:
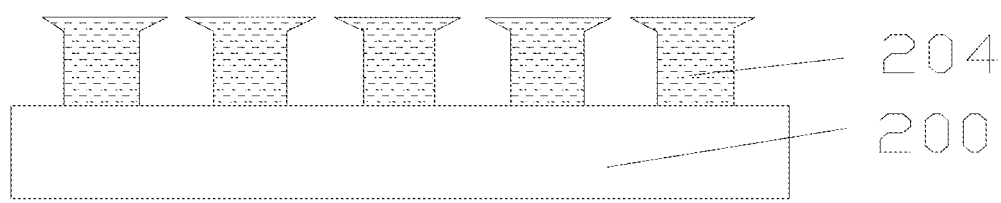

Further, returning to FIG. 1, the sacrificial layer is removed (107), and a second interconnect dielectric layer is formed on the first interconnect dielectric layer (108). The sacrificial layer may be removed through the release opening using an etching process, and the second interconnect dielectric layer may be formed on the surface of the first interconnect dielectric layer using a deposition process. FIG. 2H shows the corresponding semiconductor device 20 after removing the sacrificial layer, and FIG. 2I shows the corresponding semiconductor device 20 after forming the second interconnect dielectric layer.

As shown in FIG. 2H, the sacrificial layer 201 is removed through the releasing openings 205. The sacrificial layer 201 is removed without changing the shape of the space left by the removed sacrificial layer 201 between the second trenches 209. In other words, the shape of the top portion of the space is a trapezoidal, and the shape of the lower portion of the space is a rectangle, with the width of the top of space (i.e., releasing opening) less than (or even significantly less than) the width of the bottom of the space.

Figure 2I:
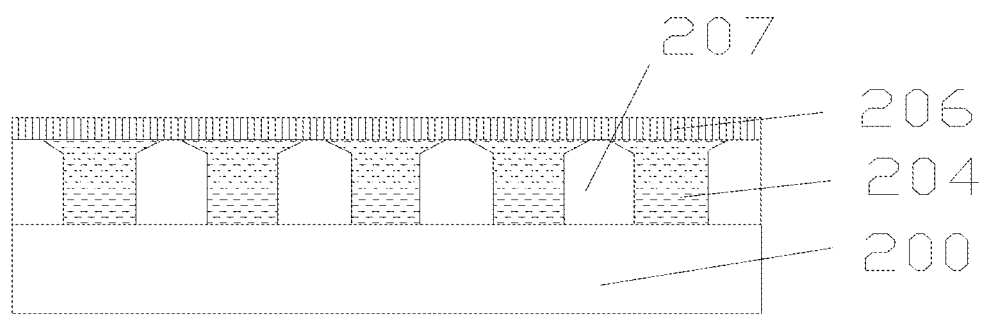

As shown in FIG. 2I, a second interconnect dielectric layer 206 is formed on the surface of the first interconnect dielectric layer 204. Because the releasing opening 205 has a relatively small width, when the second interconnect dielectric layer 206 is formed, the releasing opening 205 may be sealed or covered by the second interconnect dielectric layer 206 without filling the space of removed sacrificial layer 201.

In other words, after sealing the releasing openings 205 by the second interconnect dielectric layer 206, air gaps 207 may be formed in the first interconnect dielectric layer 204 by the space of the removed sacrificial layer 201. Thus, the dielectric constant of the interconnect dielectric layer 206 can be reduced. The second interconnect dielectric layer 206 may also include any appropriate material, such as $SiO_2$, SiON, SiN, SiC, silicon-based dielectric doped with F, C, H, B or P impurities, or low dielectric-constant films.

Figure 2J:
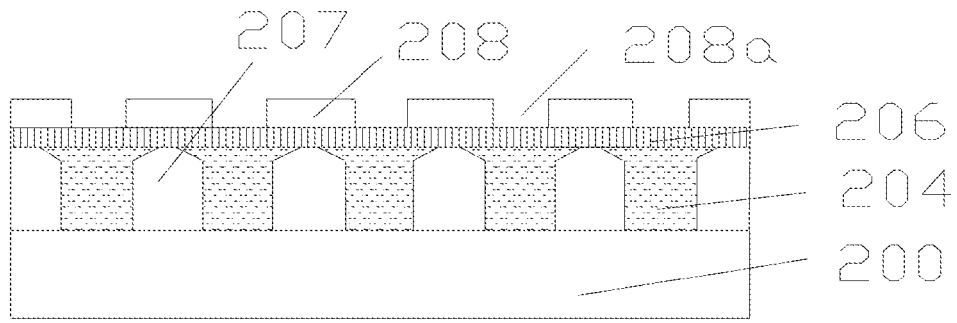

Returning to FIG. 1, after forming the second interconnect dielectric layer (108), a photoresist layer is coated on the second interconnect dielectric layer and a plurality of third windows are formed in the photoresist layer (109). The plurality of third windows may be formed in the photoresist layer by photolithography using the first mask used to form the plurality of first windows. Thus, the plurality of third windows corresponds or matches the plurality of first windows, and each third window may have a window width similar to the window width of each corresponding first window. In certain embodiments, the third windows 208a have a width smaller than that of the first window 202a. Thus, each third window has a smaller width than the corresponding second window. FIG. 2J shows the corresponding semiconductor device 20 after forming the third windows.

As shown in FIG. 2J, a photoresist layer 208 is coated on the surface of the second interconnect dielectric layer 206. A plurality of third windows 208a are formed in the photoresist layer 208 by photolithography using the same mask for forming the plurality of first windows 202a. Thus, the plurality of third windows 208a correspond to the plurality of first windows 202a, which have a smaller width than the plurality of second windows 202b.

In certain embodiments, in the photolithography process, to make the window width of the third windows 208a smaller than the window width of the first windows 202a, if over-exposure was used when forming the plurality of first windows 202a, normal-exposure or under-exposure may be used when forming the plurality of third windows 208a; if normal-exposure was used when forming the plurality of first windows 202a, under-exposure may be used when forming the plurality of third windows 208a. Other configurations may also be used.

Figure 2K:
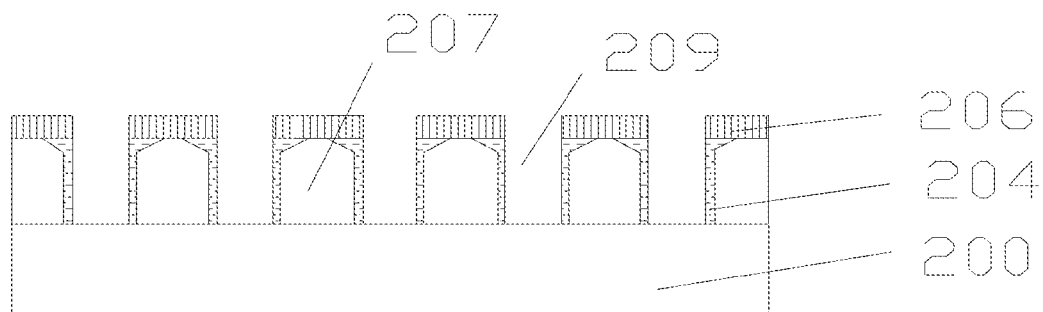

Further, returning to FIG. 1, a plurality of third trenches may be formed in the first interconnect dielectric layer and the second interconnect dielectric layer (110). The third trenches may be formed by an etching process using the plurality of third windows as a mask. FIG. 2K shows the corresponding semiconductor device 20 after forming the third trenches.

As shown in FIG. 2K, a plurality of third trenches 209 are formed through the second interconnect dielectric layer 206 and the first interconnect dielectric layer 204. Because the third windows 208a are formed using the same mask (i.e., the first mask) as the first windows 202a, the third windows 208a have similar size to the first windows 202a or smaller size than the first windows 202a. Thus, the third windows 208a also have a width smaller than the second windows 203.

Thus, because the plurality of third trenches 209 are formed using the third windows 208a as a mask and the third windows 208a may have a smaller window width than the first windows 202a, each third trench 209 has a width smaller than the corresponding second trench 203'. Thus, the air gaps 207 are kept or maintained in the remaining first interconnect dielectric layer 204 between neighboring third trenches 209. The width of the walls of the air gaps 207 is determined by the difference between the width of the third trenches 209 and the second trenches 203', which may also be determined by the difference between the width of the first windows 202a and the third windows 208a. The photoresist layer 208 is then removed after forming the third trenches 209.

Figure 2L:
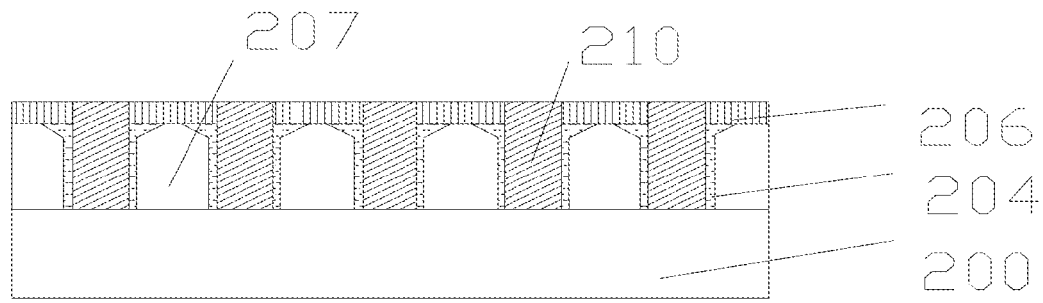

Further, returning to FIG. 1, a copper interconnect layer is formed using the plurality of third trenches (111). For example, a metal barrier layer and copper seed layer can be deposited in the third trenches by sputter deposition, and copper can then be filled in the third trenches by a copper plating process. Further, a CMP process may be used to remove extra deposited material up to the surface of the second interconnect dielectric layer to form the copper interconnect. FIG. 2L shows the corresponding semiconductor device 20 after forming the copper interconnect.

As shown in FIG. 2L, a copper interconnect layer 210 is formed in the third trenches 209 up to the surface of the second interconnect dielectric layer 206. The copper barrier layer may include any appropriate material, such as Ta, TaN, Ti, TiN or CoWP. It should be noted that, although trenches are used to illustrate copper interconnect 210, vias or through holes may also be used to form copper interconnect 210 in a similar way. Other interconnect structures may also be used. In this disclosure, trenches, vias, and other similar structures may be referred to as copper conduits (or simply called conduits) to be filled with copper for forming the copper interconnect 210.

Figure 4A:
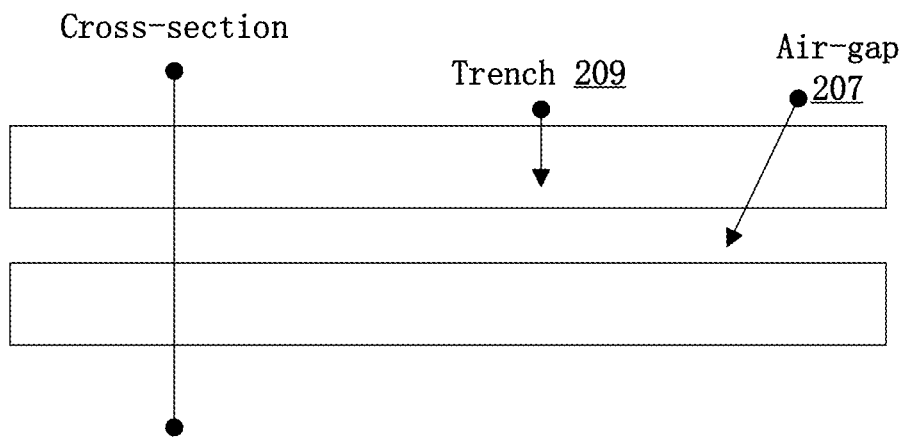
FIGS. 4A-4B illustrate exemplary trench-based and via-based copper interconnect structures.
Figure 4B:
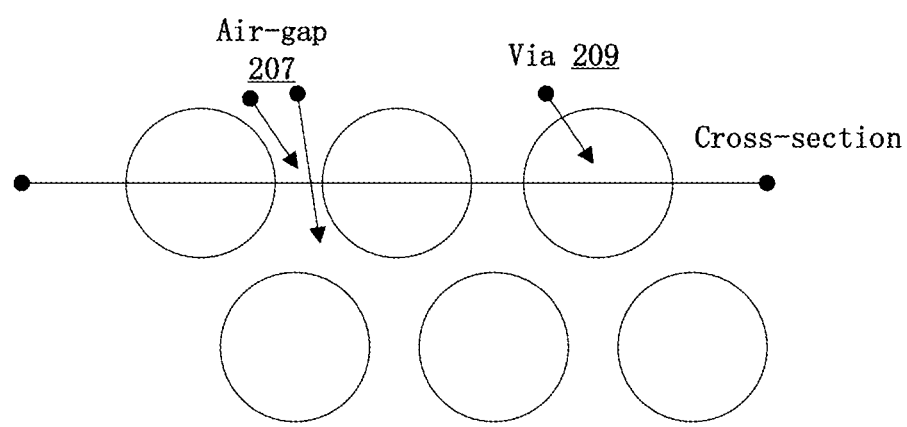

For example, FIG. 4a shows trenches forming the copper interconnect 210 and FIG. 4b shows vias forming the copper interconnect 210. In certain embodiments, some portion of copper interconnect 210 may include trenches and some other portion of copper interconnect 210 may include vias. As shown in FIG. 4a and FIG. 4b, the cross-section views of the trench-based copper interconnect 210 and the via-based copper interconnect 210 may be similar. Thus, the process for forming trenches 209 and vias 209 may also be similar. However, certain differences may exist because the difference between the geometrical shapes of the trenches and vias.

For example, as shown FIG. 4b, plurality of openings created based on the first windows 202a, second windows 202b, and third windows 208a may have a shape of a cylinder or a square prism (i.e., having cross-sectional shape of a circle or a square); while in FIG. 4a, the plurality of openings created based on the first windows 202a, second windows 202b, and third windows 208a may have a shape of a trench. Further, as shown in FIG. 4b, air-gap 207 may be formed between neighboring vias from the same row of vias or from different rows of vias. Other shapes and configuration may also be used.

Therefore, copper interconnect layer 210 is completed in the semiconductor device 20. The completed semiconductor device 20 as shown in FIG. 2L includes substrate 200, an interconnect dielectric layer containing first interconnect dielectric layer 204 and second dielectric layer 206. The semiconductor device 20 also includes plurality of trenches or vias passing through first interconnect dielectric layer 204 and second dielectric layer 206. The plurality of trenches or vias are filled with copper to form copper interconnect 210. The first interconnect dielectric layer 204 between the trenches or vias further contain air gaps or cavities 207. The top of the air gaps or cavities 207 is covered by the second interconnect dielectric layer 206, and the bottom of the air gaps or cavities 207 is the substrate 200. Further, the upper portion of an air gap or cavity 207 is in a shape of a trapezoid, and the lower portion of the air gap or cavity 207 is in a shape of a rectangle. Thus, the width of the top of cavity 207 is smaller than the width of the bottom of the cavity 207, e.g., the top of cavity 207 may be in a range of approximately 10 nm-300 nm. Further, the substrate 200 can include pre-made device layer(s) and/or interconnect layer(s).

Additionally or optionally, the above described process may include certain steps for forming more than one copper interconnect layers using a single CMP process (e.g., a dual-Damascus process). FIGS. 3A-3E shows corresponding semiconductor device 20 when forming more than one copper interconnect layers.

Figure 3A:
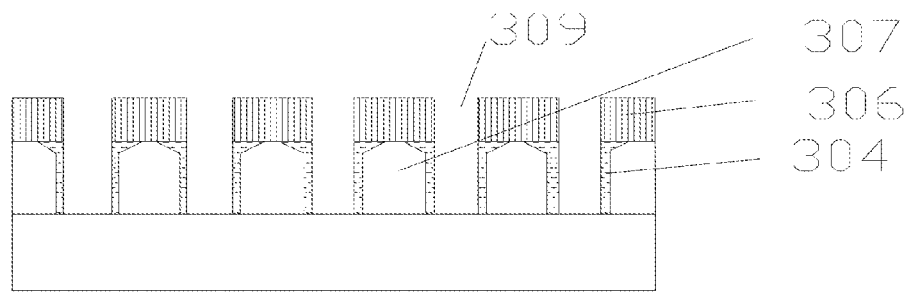
FIGS. 3A-3E illustrate certain other corresponding stages of the semiconductor device during the copper interconnect manufacturing process consistent with the disclosed embodiments.

As shown in FIG. 3A, corresponding to FIG. 2K, first interconnect dielectric layer 304 and second interconnect dielectric layer 306 are formed on the substrate. The air gaps or cavities 307 are formed in the first interconnect dielectric layer 304. Further, through holes or vias 309 are similarly formed through the first interconnect dielectric layer 304 and second interconnect dielectric layer 306.

Figure 3B:
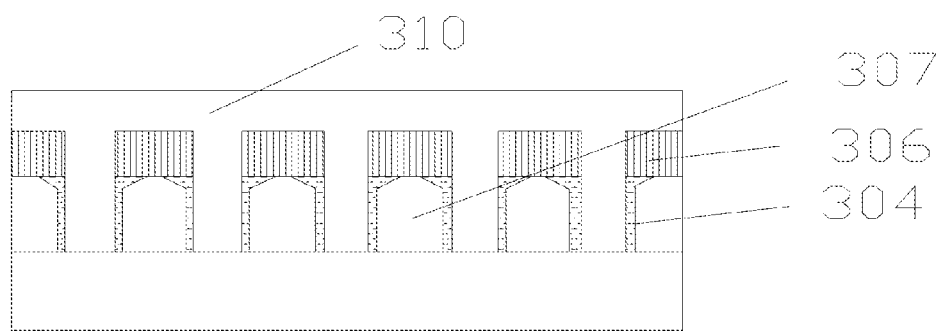

As shown in FIG. 3B, after forming the plurality of vias 309, instead of forming the copper interconnect as shown in FIG. 2L, a photoresist layer 310 is formed on the surface of the second interconnect dielectric layer 306.

Figure 3C:
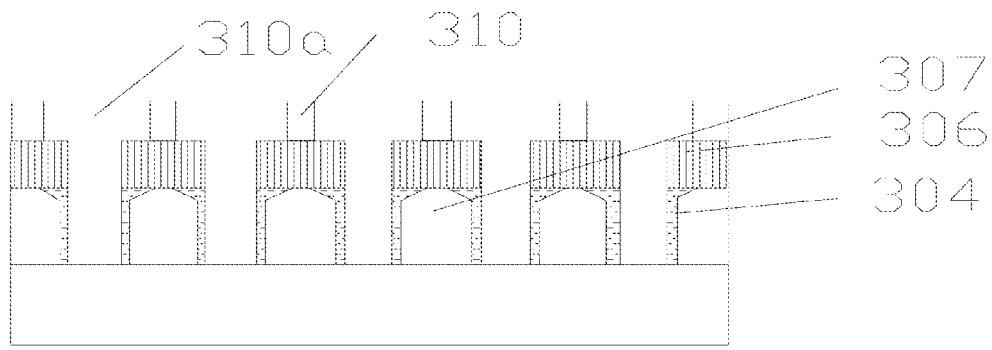

Further, as shown in FIG. 3C, a plurality of fourth windows 310a are formed in the photoresist layer 310 by photolithography. The fourth windows 310a may be used to form a plurality trenches for a second copper interconnect layer.

Figure 3D:
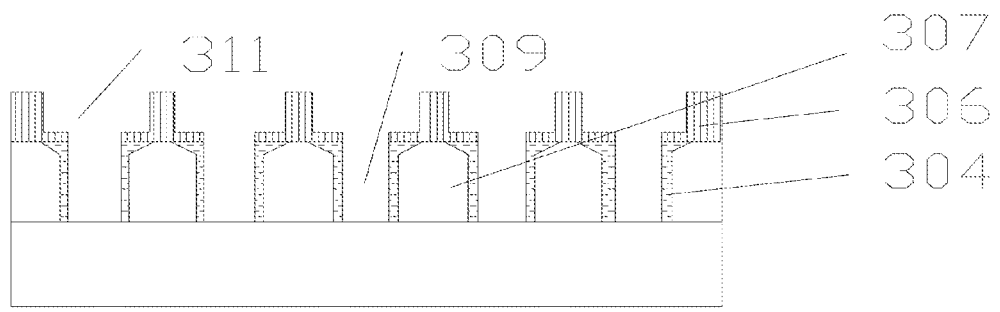

After forming the plurality of fourth windows 310a, as shown in FIG. 3D, a plurality of trenches 311 are formed in the second interconnect dielectric layer 306 by an etching process using the plurality of fourth windows 310a as a mask. Further, the photoresist layer 310 is then removed after forming the plurality of trenches 311. Although FIG. 3C shows that the window width of the fourth windows 310a is greater than the window width of the plurality of vias 309, any window width may be used. In certain embodiments, the window width of the fourth windows 310a may be the same as or smaller than the window width of the plurality of vias 309.

Figure 3E:
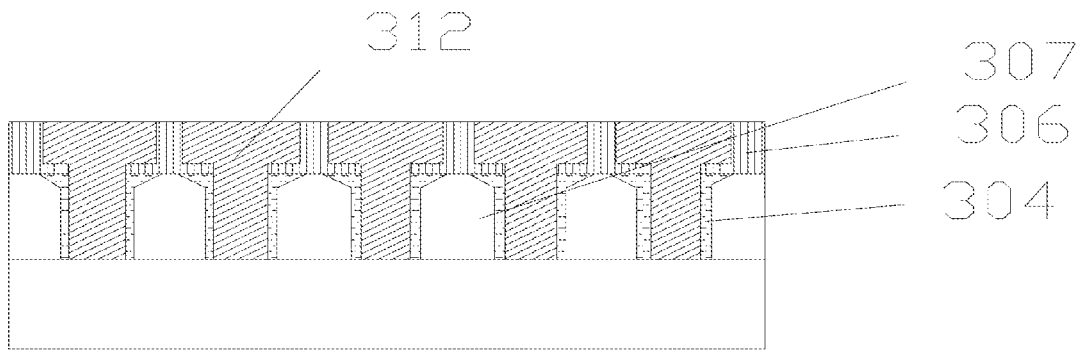

The plurality of trenches 311 may be interconnected with the plurality of vias 309 such that copper interconnect 312 can be formed in both the plurality of trenches 311 and the plurality of vias 309, as shown in FIG. 3E. That is, the copper interconnect 312 includes a first copper interconnect layer formed in the plurality of vias 309 and a second copper interconnect layer formed in the plurality of trenches 311. And the first copper interconnect layer of the plurality vias 309 and the second copper interconnect layer of the plurality trenches 311 may be selectively interconnected to form two layers of copper interconnect. More specifically, metal barrier layers and copper seed layers can be deposited in the plurality of trenches 311 and the plurality of vias 309, and copper can then be filled in the plurality of trenches 311 and the plurality of vias 309 by a copper plating process.

Further, a CMP process may be used to remove deposited material up to the surface of the second interconnect dielectric layer 306 to form the copper interconnect 312. The copper barrier layer may include any appropriate material, such as Ta, TaN, Ti, TiN or CoWP. Although vias 309 and trenches 312 are used for illustrative purposes, vias 309 may be trenches and trenches 312 may be vias. Other configurations may also be used.

The disclosed devices and methods may provide many advantageous applications. By using the disclosed devices and methods, air gaps between interconnect dielectric layers are formed using a sacrificial layer, and the dielectric constant of the interconnect dielectric layers can be reduced. Thus, the RC delay of the copper interconnect can be reduced and the chip performance can be improved. Further, during the fabrication process, the patterning process for forming the air gaps in the dielectric layers and the patterning process for forming the copper interconnect trenches or vias can use a same mask, which may lower manufacturing cost. Other advantages and applications are obvious to those skilled in the art.

The invention claimed is:

1. A method for manufacturing a semiconductor device with a copper interconnect structure, comprising:
   providing a substrate;
   forming a sacrificial layer on the substrate;

forming a photoresist layer on the sacrificial layer;
forming a plurality of first windows in the photoresist layer by photolithography using a first mask;
forming a plurality of first openings in the sacrificial layer by an etching process using the first windows as a mask;
forming a plurality of second windows in the photoresist layer corresponding to the plurality of first windows, wherein a width of each of the second windows is greater than a width of the corresponding first window such that a portion of the sacrificial layer is exposed in the second windows;
forming a plurality of second openings by an etching process using the second window as a mask such that the top portion of each of the second openings is in a shape of an inverted trapezoid;
removing the photoresist layer;
depositing a layer of dielectric material on the sacrificial layer and in the second openings; and
forming the first interconnect dielectric layer by removing the deposited layer of dielectric material using a chemical mechanical polishing (CMP) process until a tip of the sacrificial layer between two second openings is also removed to form a releasing opening;
removing the sacrificial layer to form cavities with corresponding releasing openings as the top of the cavities;
depositing a second interconnect dielectric layer on the first interconnect dielectric layer such that the second interconnect dielectric layer seals the releasing openings without filling the cavities;
forming a second photoresist layer on the second interconnect dielectric layer;
forming a plurality of third windows in the second photoresist layer by photolithography using the first mask such that the third windows have a smaller window width than the first windows; and
forming a plurality of conduits in the first interconnect dielectric layer and the second interconnect dielectric layer by an etching process using the third windows as a mask such that the cavities are maintained in the first interconnect dielectric layer; and
depositing copper in the plurality of conduits to form a copper interconnect layer of the copper interconnect structure, wherein:
the first interconnect dielectric layer, between neighboring conduits, contains the plurality of cavities each in a shape of a combination of a trapezoid and a rectangle such that dielectric constant of the first interconnect dielectric layer is reduced;
the second interconnect dielectric layer seals the top of the cavities;
the substrate forms a bottom surface of the cavities; and
a width of the top of the cavities is less than a width of the bottom of the cavities; an upper portion of each cavity is in a shape of a trapezoid; a lower portion of each cavity is in a shape of a rectangle.

2. The method according to claim 1, wherein:
the width of the releasing opening is in a range of approximately 10 nm-300 nm.

3. The method according to claim 1, wherein:
the dielectric material is one of $SiO_2$, SiON, SiN, SiC, silicon-based dielectric doped with F, C, H, B or P impurities, and low dielectric-constant film.

4. The method according to claim 1, wherein:
the second windows are formed by respectively expanding the corresponding first windows horizontally in the photoresist layer using $O_2$ plasma.

5. The method according to claim 1, wherein:
the sacrificial layer is one of amorphous silicon and polyamide.

6. The method according to claim 5, wherein:
in the case where the sacrificial layer is amorphous silicon, the sacrificial layer is removed using $XeF_2$ as an etchant; and
in the case where the sacrificial layer is polyamide, the sacrificial layer is removed using $O_2$ as an etchant.

7. The method according to claim 1, wherein:
in the processes of forming the plurality of first windows and the plurality of third windows using the same first mask, in the case where the plurality of first windows are formed by using over-exposure, the plurality of third windows are formed by using normal-exposure or under-exposure; in the case where the plurality of first windows are formed by using normal-exposure, the plurality of second windows are formed by using under-exposure.

8. The method according to claim 1, wherein the depositing copper further includes:
depositing a metal barrier layer and copper seed layer in the plurality of conduits by sputter deposition;
filling copper in the conduits by a copper plating process; and
removing extra deposited copper by a CMP process up to the surface of the second interconnect dielectric layer to form the copper interconnect layer.

9. The method according to claim 1, wherein:
the plurality of conduits are plurality of vias or plurality of trenches.

* * * * *